US006560152B1

(12) United States Patent
Cernea

(10) Patent No.: US 6,560,152 B1
(45) Date of Patent: May 6, 2003

(54) NON-VOLATILE MEMORY WITH TEMPERATURE-COMPENSATED DATA READ

(75) Inventor: Raul-Adrian Cernea, Santa Clara, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/053,171

(22) Filed: Nov. 2, 2001

(51) Int. Cl.[7] .................................................. G11C 7/04
(52) U.S. Cl. .............. 365/211; 365/189.09; 365/185.22
(58) Field of Search ............................ 365/211, 189.09, 365/185.22, 185.23, 185.24, 242

(56) References Cited

U.S. PATENT DOCUMENTS 5,172,338 A    12/1992    Mehrotra et al.
6,205,074 B1 *  3/2001   Van Buskirk et al. .. 365/185.22

FOREIGN PATENT DOCUMENTS

JP           2000011671           1/2000

* cited by examiner

*Primary Examiner*—David Lam
(74) *Attorney, Agent, or Firm*—Parsons Hsue & de Runtz LLP

(57) ABSTRACT

A novel non-volatile memory is disclosed. The non-volatile memory includes an array of data storage cells that individually include a storage element such as a floating gate, a control gate and first and second source/drain terminals. A current source provides a current to the first source/drain terminal of the data storage element. A node is electrically connected to the second source/drain terminal of the data storage element. A bias circuit provides a bias voltage to the node. The bias voltage varies with temperature in a manner approximately inverse to the thermal variation of the threshold voltage of the data storage element. A control gate voltage circuit provides a voltage level to the control gate of the data storage cell.

12 Claims, 4 Drawing Sheets

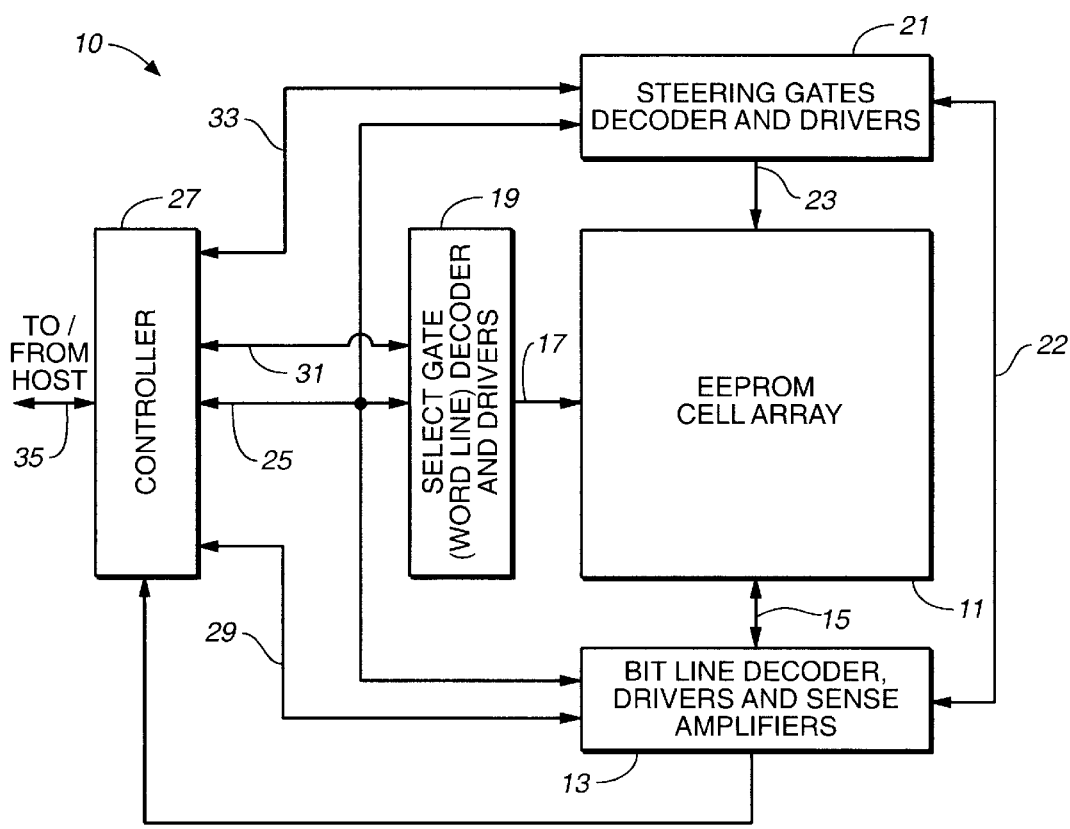
FIG._1

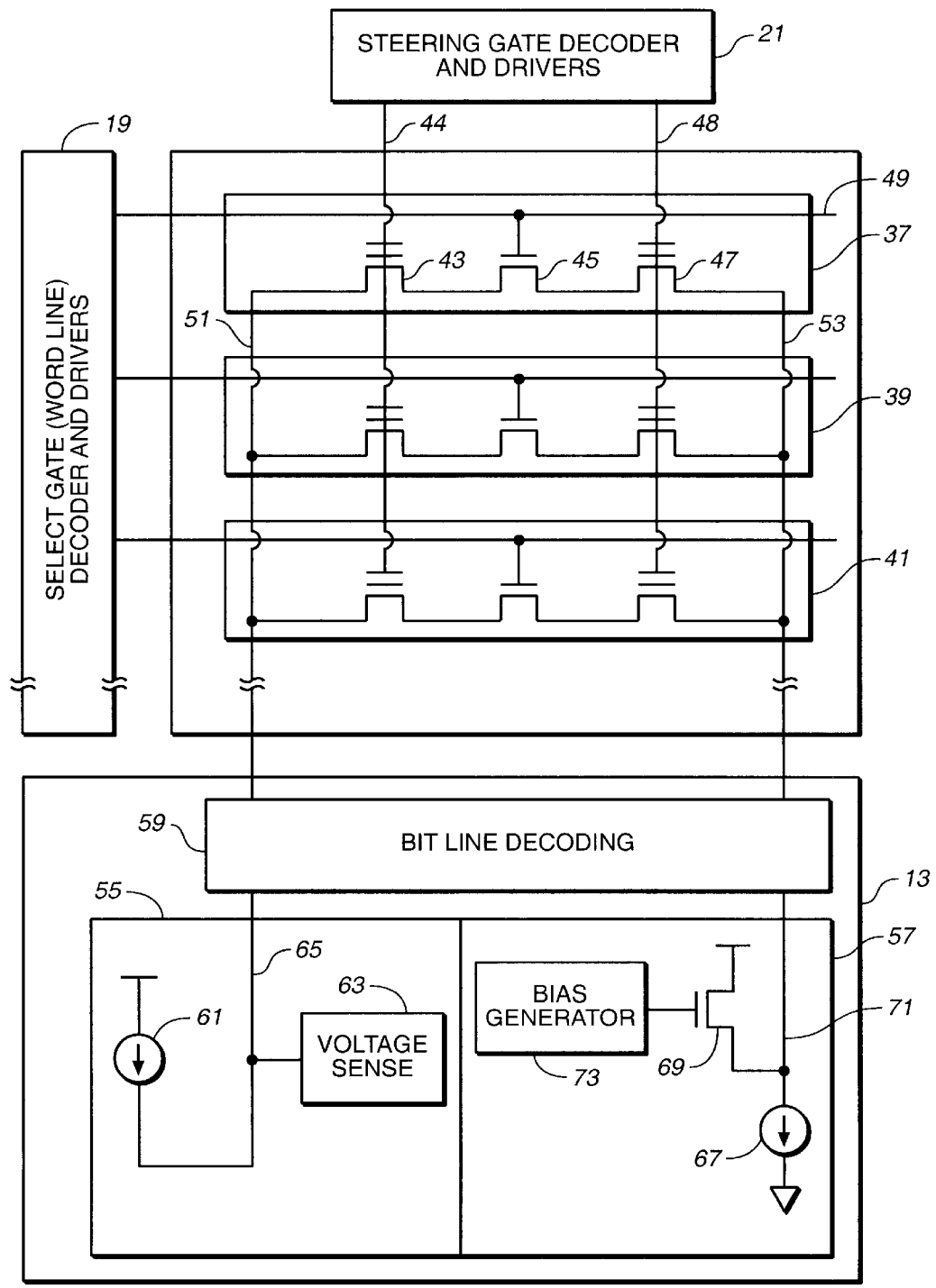
FIG._2

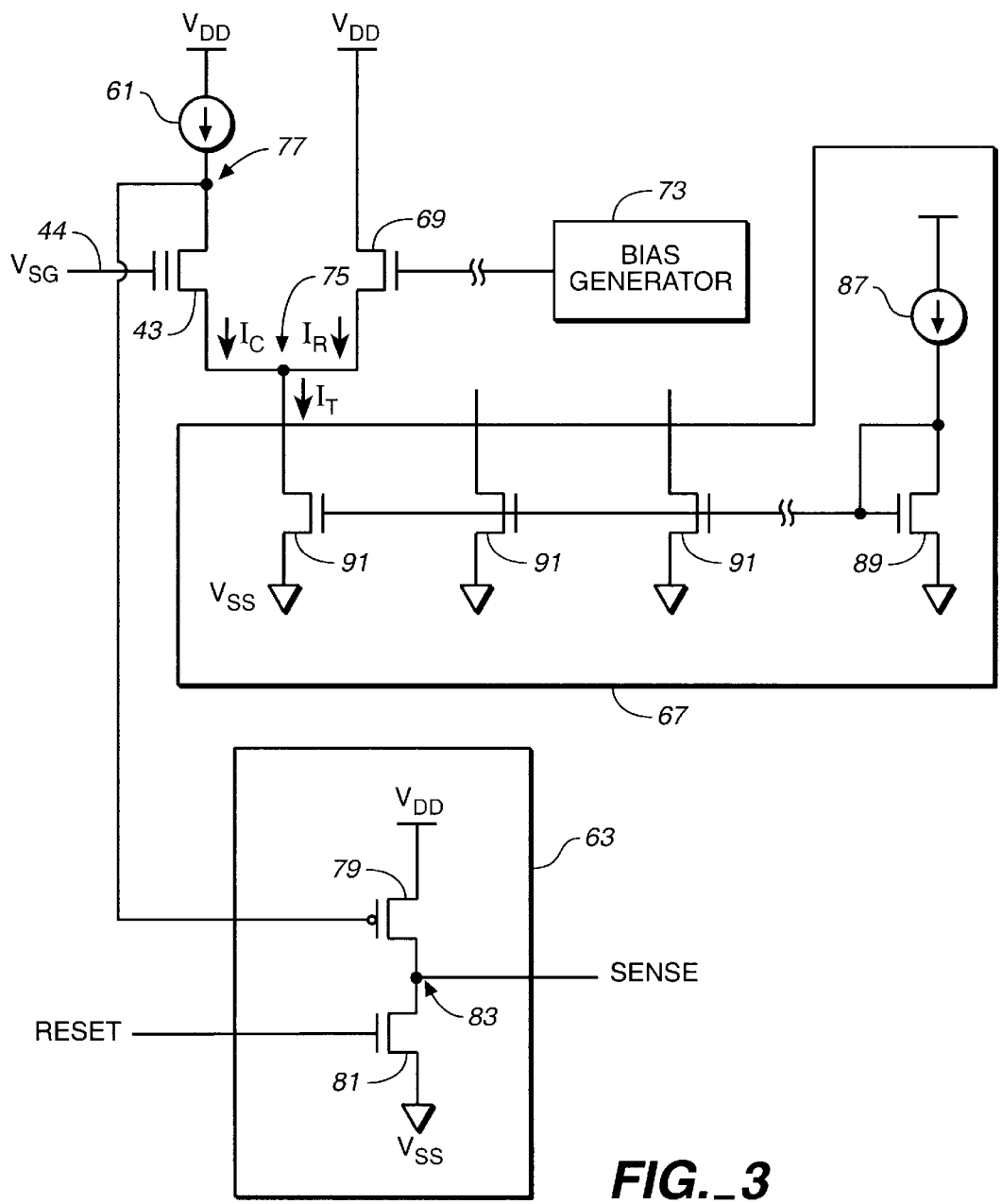
FIG._3

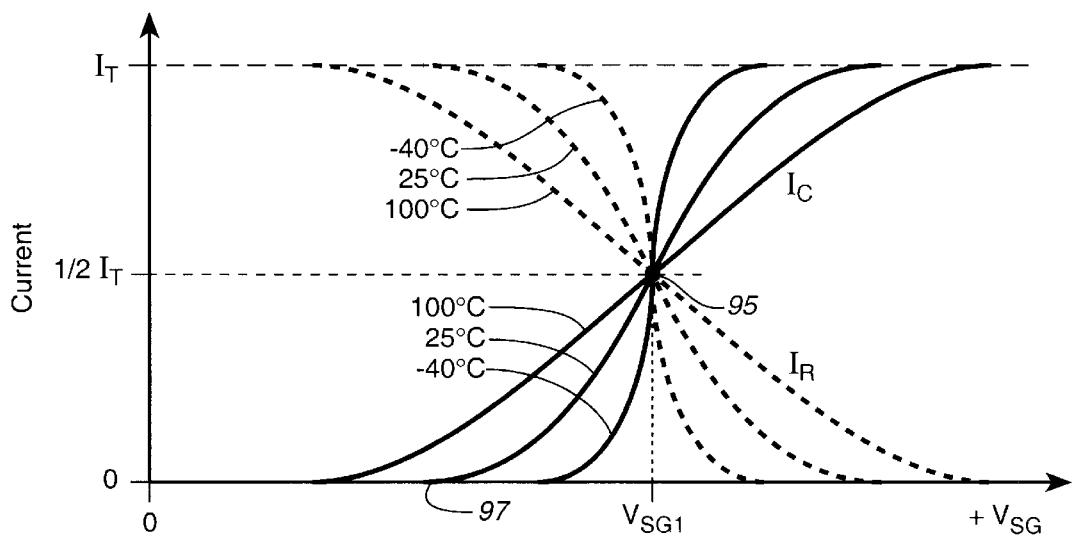
FIG._4A
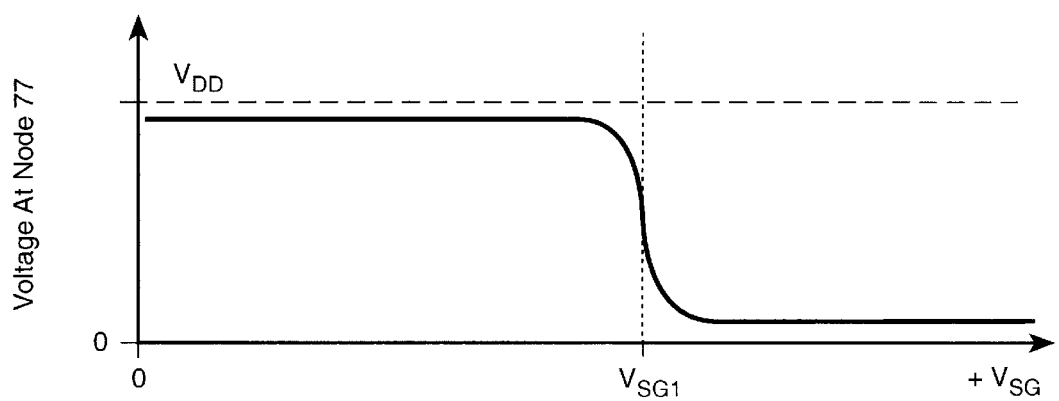
FIG._4B

NON-VOLATILE MEMORY WITH TEMPERATURE-COMPENSATED DATA READ

TECHNICAL FIELD OF THE INVENTION

The present invention relates to non-volatile memories, and in particular to a non-volatile memory with a temperature-compensated data read cycle.

BACKGROUND OF THE INVENTION

A popular non-volatile memory system is a flash electrically erasable, programmable read only memory (EEPROM). Individual cells of such a memory typically include one or more storage elements that store a variable amount of static charge. The storage elements are most commonly conductive floating gates, so this is the example primarily described herein, but can also be areas of a charge trapping dielectric. The level of charge stored by the floating gate represents the data value stored by the data storage element. The floating gate typically overlies a channel region of a transistor.

Data is read from a storage location by applying a voltage to a control gate overlying the floating gate. The level of charge stored by the floating gate, in combination with the voltage applied to the control gate, determines whether the transistor will conduct current through its channel. The level of charge stored by the floating gate can therefore be determined by either measuring that current or finding the control gate voltage required to make the transistor conduct. In either case, the measured quantity is compared with reference levels in order to determine the state of the cells.

Binary state memory cells may be used in flash memories. These memory cells have two states: "programmed" (usually representing a one) and "erased" (usually representing a zero). However, such cells do not efficiently use the valuable real estate of the integrated circuit, since only one bit of information is stored per floating gate. Many flash memories therefore use multiple charge levels (more than two) for the floating gates, so that each floating gate may store more than one bit of information.

As the number of charge level states of the operation of individual floating gates increases, the voltage difference between the states necessarily decreases. The increasing proximity of the voltage level ranges of an increased number of states makes discerning one state from another more difficult.

Because the operating characteristics of the memory cell transistors change with temperature, the control gate voltage required to turn on the transistor also varies with temperature, even as the charge level carried by the floating gate remains unchanged. This thermal variation can result in inaccurate reading of data from memory cells, due to the close proximity of the voltage levels of the floating gate.

One technique to compensate for the effects of such temperature variations is to include reference memory cells, formed in the same manner as the data storage cells and on the same integrated circuit chip, that provide the reference levels against which the measured currents or voltages of the memory cells are compared in order to read their storage states. The reference cells are therefore affected in the same manner by temperature variations of the circuit chip as are the memory storage cells. The reference levels then move with temperature in the same manner as the values read from the memory cells. This technique is described in U.S. Pat. No. 5,172,338, which patent is incorporated herein by this reference.

Other techniques use a device other than a memory cell as a temperature reference. A band gap device is an example of such a device that can be provided on the same chip as the storage cells or elsewhere in thermal communication with such a chip. Voltages applied to control gates of the memory cells have been controlled in this manner.

SUMMARY OF THE INVENTION

The present invention, briefly and generally, provides a technique for temperature compensated reads of non-volatile memory cells by varying a bit-line voltage or current in response to changing temperature. The invention is implemented in one form by providing a circuit on the memory cell array chip that, during a read operation, automatically biases a voltage or current applied to the cells' source or drain terminal by an amount that compensates for a changing threshold voltage characteristic of the memory cells that is caused by a changing temperature of the circuit chip.

In one embodiment, the non-volatile memory includes a storage resistor having a data storage element such as a floating gate, one or more control gates and first and second source/drain terminals. A current source provides a current to the first source/drain terminal of the data storage element. A node is electrically connected to the second source/drain terminal of the data storage element. A bias circuit provides a bias voltage to the node. The bias voltage varies with temperature in a manner approximately inverse to the thermal variation of the threshold voltage of the data storage transistor. A control gate voltage circuit provides a controlled voltage level to the control gate(s) of the data storage transistor.

In a more specific embodiment, a method of reading stored data from a non-volatile memory includes providing a current to a first source/drain terminal of an EEPROM transistor which has a second source/drain terminal coupled to a node. The method further includes drawing a current from the node by a current source and providing a thermally invariant bias voltage to a gate of a transistor which has a source or drain terminal coupled to the node. The transistor conducts at least a portion of the current. The method also includes providing a voltage to a control gate of the EEPROM transistor and detecting a voltage at the first source/drain terminal of the EEPROM transistor.

An advantage of the present invention is that the temperature of the memory cell does not affect the data value read from the memory cell transistor. Another advantage of the present invention is that temperature compensation is achieved with the use of minimal additional circuitry, thus taking less space on the memory chip.

BRIEF DESCRIPTION OF THE DRAWINGS

For a more complete understanding of the present invention and for further features and advantages, reference is now made to the following description taken in conjunction with the accompanying drawings, in which:

FIG. 1 is a block diagram of a memory system incorporating aspects of the present invention;

FIG. 2 is a schematic diagram in partial block form of a portion of the memory cell array of FIG. 1;

FIG. 3 is an equivalent schematic diagram of a portion of the memory circuit of FIG. 2;

FIG. 4A shows several characteristic current-voltage curves of a modified version of the circuit of FIG. 3; and FIG. 4B is a curve illustrating one voltage during operation of the circuit of FIG. 3.

DETAILED DESCRIPTION OF THE INVENTION

The preferred embodiments of the present invention and their advantages are best understood by referring to FIGS. 1, 2, 3, 4A and 4B of the drawings. Like numerals are used for like and corresponding parts of the various drawings.

Referring to FIG. 1, a block diagram of an example memory system 10 incorporating aspects of the present invention is shown. Memory system 10 includes a large number of individually addressable memory cells arranged in a regular array 11 of rows and columns, although other physical arrangements of cells are possible. Bit lines (not shown in FIG. 1) extend along columns of array 11 and are connected to a bit line decoder and driver circuit 13 through lines 15. For one type of memory cell array, two different sets of control gates are employed, word lines and steering gates. Word lines (not shown in FIG. 1) extend along rows of array 11 and are connected through lines 17 to a word line decoder and driver circuit 19. Steering gate lines (not shown in FIG. 1) extend along columns of array 11 and are connected to a steering gate decoder and driver circuit 21 through lines 23.

Each of the decoders 13, 19 and 21 receives memory cell addresses over a bus 25 from a memory controller 27. The decoder and driver circuits are also connected to controller 27 over respective control and status signal lines 29, 31 and 33. Voltages applied to the steering gates and bit lines are coordinated through a bus 22 that interconnects the decoder and driver circuits 13 and 21.

Controller 27 is connectable through lines 35 to a host device (not shown). The host may be, for example, a personal computer, notebook computer, digital camera, audio player, or any of various other hand-held electronic devices. The memory system of FIG. 1 will commonly be implemented in a card according to one of several existing physical and electrical standards, such as the standards set by the PCMCIA, the CompactFlash™ Association, the MMC™ Association or the Secure Digital (SD) Card Association. When in a card format, the lines 35 terminate in a connector on the card which interfaces with a complementary connector of the host device. The electrical interface of many cards follows the ATA standard, wherein the memory system appears to the host as if it were a magnetic disk drive. Other memory card interface standards also exist. Alternatively to the card format, memory systems of the type shown in FIG. 1 are embedded in the host device.

The memory cells of array 11 may be of a type described in U.S. Pat. Nos. 6,091,633, 6,103,573 and 6,151,248 and in U.S. patent applications Ser. No. 09/667,344, filed Sep. 22, 2000, entitled "Non-Volatile Memory Cell Array Having Discontinuous Source And Drain Diffusions Contacted By Continuous Bit Line Conductors And Methods of Forming," and Ser. No. 09/925,102, filed Aug. 8, 2001, entitled "Scalable Self-Aligned Dual Floating Gate Memory Cell Array and Methods of Forming the Array." These patents and application are incorporated herein by this reference in their entirety. This type of cell includes two floating gate storage elements positioned on opposite sides of a select transistor. Each floating gate of the cell is also controlled by a separate steering gate.

Referring to FIG. 2, a schematic diagram in partial block form of a portion of memory system 10 is shown. Memory cell array 11 includes memory cells 37, 39 and 41 arranged in a column. For purposes of illustration, only a portion of the memory cell column is shown, and it will be understood that array 11 usually includes many such columns. Schematic representations of memory cells 37, 39 and 41 are shown in FIG. 2, based on the two floating gate type of memory cell described in the aforementioned U.S. Patents and Applications that are incorporated herein.

Memory cell 37 will be used as an exemplary cell for purposes of illustration. The other cells in array 11 may be identical to cell 37 within the limits allowed by semiconductor device fabrication processes.

Memory cell 37 includes three transistors 43, 45 and 47. Transistors 43 and 47 are EEPROM transistors. The control gates of transistors 43 and 47 include two steering gates of memory cell 37. These two steering gates are connected to (or form part of) steering gate lines 44 and 48, respectively, which are controlled by steering gate decoder and driver circuit 21. The floating gates of transistors 43 and 47 represent the two floating gates of memory cell 37.

Transistor 45 is a cell select transistor, typically an n-channel field effect transistor. The gate of transistor 45, which represents the select gate of memory cell 37, is connected to a word line 49 controlled by word line decoder and driver circuit 19.

The channels of transistors 43, 45 and 47 are connected in series between source and drain terminals that are connected with two bit lines 51 and 53. Thus, if all three transistors 43, 45 and 47 are turned on (or made to conduct), a conduction path exists between bit lines 51 and 53.

Bit line decoder and driver circuit 13 includes a drain-side bit line circuit 55 and a source-side bit line circuit 57. As explained further herein, drain-side bit line circuit 55 and source-side bit line circuit 57 represent the data read circuitry of bit line decoder and driver circuit 13. Bit line decoder and driver circuit 13 also includes data write circuitry, which is beyond the scope of this disclosure.

In this example, it will be assumed that drain-side bit line circuit 55 is connected to bit line 51 by bit line decoding circuitry 59, while source-side bit line circuit 57 is connected to bit line 53 by bit line decoding circuitry 59. This arrangement is chosen merely for purposes of illustration. Both a drain-side bit line circuit such as circuit 55 and a source-side bit line circuit such as circuit 57 are available for each bit line in memory cell array 11. Thus, each bit line 51, 53 may be connected to either a drain-side bit line circuit such as circuit 55 or a source-side bit line circuit such as circuit 57. Bit line decoding circuitry 59 is responsible for connecting one of the bit lines in memory cell array 11 to a drain-side bit line circuit such as circuit 55, and for connecting an adjacent bit line to a source-side bit line circuit such as circuit 57.

Drain-side bit line circuit 55 includes a current source 61 and a voltage sense circuit 63, both connected to a line 65. In this example, line 65 is coupled to bit line 51 by bit line decoding circuitry 59. Current source 61 provides a selected current to line 65 and bit line 51. Voltage sense circuit 63 senses the voltage on line 65.

Source-side bit line circuit 57 includes a current source 67 and a transistor 69 connected to a line 71. In this example, line 71 is coupled to bit line 53 by bit line decoding circuitry 59. Current source 67 is connected between line 71 and ground (or $V_{SS}$), and draws a constant current from line 71 and bit line 53. The drain of transistor 69 is connected to a supply voltage ($V_{DD}$), while the gate is connected to a bias voltage generator 73. The source of transistor 69 is connected to line 71. Transistor 69 supplies at least some of the current drawn by current source 67. Transistor 69 acts as a source follower, creating a voltage on line 71 equal to the bias voltage from bias voltage generator 73 minus a transistor threshold voltage.

The process by which data is read from memory cell 37 by drain-side bit line circuit 55 and a source-side bit line circuit 57 will now be described. For purposes of illustration, it will be assumed that each floating gate of memory cell 37 may carry one of four designated charge levels. Each floating gate therefore stores two bits of information, so that memory cell 37 stores a total of four bits of information.

During a read operation, one of the steering gates 44 or 48 of memory cell 37 (i.e. one of the control gates of transistors 43 and 47) is overdriven so that the corresponding transistor 43 or 47 is turned on regardless of the charge level carried by the transistors floating gate. As an example, it will be assumed that steering gate line 48 is overdriven (for example, driven to 4 volts), so that the state of the floating gate of transistor 47 is irrelevant to the data read operation.

Word line 49 is selected for the read operation by word line decoder and driver circuit 19. Word line 49 therefore carries a voltage sufficient to turn on transistor 45 hard (for example 3 volts). Steering gate line 44 is driven to one of the normal data read levels as described below, so that the charge level of the floating gate of transistor 43 may be detected.

The resulting equivalent schematic diagram is shown in FIG. 3. Current source 67 draws a constant current from a node 75. Transistors 43 and 69 form a differential pair with their sources connected to node 75. The gate of transistor 69 is biased by bias voltage generator 73, which may be a conventional, thermally insensitive band gap generator. Transistor 69 acts as a source follower, so that the voltage at node 75 is equal to the gate voltage of transistor 69 minus the transistor threshold voltage. The threshold voltage of transistor 69 varies with temperature, as does the threshold voltage of transistor 43. Node 75 and the source of transistor 43 are therefore biased to a thermally variable voltage level. This variable source biasing of transistor 43 is advantageous for the reasons described below. Transistor 69 may be located in thermal proximity to transistor 43, so that the two threshold voltages respond to approximately the same temperature. For example, if memory system 10 and memory cell array 11 are divided into segments, transistor 69 may be located in or near the segment-containing transistor 43. Transistors 43 and 69 may also be matched so that the threshold voltages of the two transistors vary to a similar extent with temperature.

The steering gate voltage which is sufficient to turn on transistor 43 depends on the charge level carried by the floating gate of transistor 43. Steering gate 44 is therefore stepped through four different voltage levels to determine which turns on transistor 43. An example schedule of the voltages applied to steering gate 44 is presented in Table A. Each voltage is applied about 1000 ns after the previous voltage was applied.

TABLE A

| Steering gate voltage $V_{SG}$ | Time |
|---|---|
| 0 V | 0 ns |
| 1 V | 1000 ns |
| 2 V | 1000 ns |
| 3 V | 1000 ns |

When a steering gate voltage sufficient to turn on transistor 43 is reached, a conduction path is established between current source 61 and current source 67. Current source 61 is designed to generate a current that is less than that drawn by current source 67, these currents being related by a selected ratio, an example ratio being one-to-two. That is, the current supplied by the source 61 is one-half that supplied by the source 67. This establishes an appropriate source bias voltage at node 75. This also ensures that, when transistor 43 is turned on, node 77 (the drain of transistor 43) drops from approximately $V_{DD}$ to a voltage closer to that of node 75. The node 77 shown in FIG. 3 represents a point along lines 51 and 65 of FIG. 2 when connected through the decoder 59.

In this example, this voltage drop at node 77 is detected by voltage sense circuit 63, which includes a p-channel transistor 79 and an n-channel transistor 81 connected in series between $V_{DD}$ and $V_{SS}$. The gate of transistor 79 is connected to node 77. The gate of transistor 81 receives a reset signal. A node 83 connecting the drains of transistors 79 and 81 provides the data sense output of the circuit.

Prior to a data read cycle, the voltage at node 83 is set to approximately $V_{SS}$. This is accomplished by a temporary assertion of the reset signal, which briefly turns on transistor 81. The steering gate voltage cycle described above and shown in Table A may then be started. When the threshold voltage of transistor 43 is reached, the voltage at node 77 drops from approximately $V_{DD}$ to a voltage close to that of node 75. This voltage drop is sufficient to turn on transistor 79. The voltage at node 83 therefore rises to approximately $V_{DD}$. In this manner, voltage sense circuit 63 amplifies and inverts the voltage level output at node 77. The sense output from voltage sense circuit 63 may then be used as a binary output to determine which steering gate voltage was sufficient to turn on transistor 43, which in turn determines the charge level stored in the corresponding floating gate. Transistor 81 may be also used as a current source.

As previously mentioned, transistor 69 and transistor 43 are preferably located in thermal proximity. The threshold voltages of these two transistors therefore respond to approximately the same temperature. Moreover, transistors 43 and 69 are preferably matched, as a result of the technological process, so that the threshold voltages of the two transistors vary to a similar extent with temperature. Transistor 69, as a source follower, effectively converts its thermally invariant gate voltage to a thermally variable source voltage at node 75. This thermally variable source biasing for transistor 75 compensates for the temperature variation of the threshold voltage of transistor 75. The (substantially thermally invariant) steering gate voltages set forth in Table A may therefore be used without concern for variations in chip temperature. That is, the steering gate voltage which is sufficient to turn on transistor 43 depends on the charge level stored in its floating gate and on the voltage on the gate of transistor 69, and not on the local temperature of transistor 43.

An explanation of the characteristics of the circuit of FIG. 3 will initially assume that the current source 61 is eliminated and replaced with a current meter. An example of the flow of current into and out of the node 75 of FIG. 3, as so modified, as a function of the steering gate voltage $V_{SG}$ is given in FIG. 4. A current $I_T$ from the current source 67 is split at the node 75 into currents $I_C$ (through the memory cell transistor 43) and $I_R$ (through the transistor 69). The solid curves of FIG. 4 show the current-voltage characteristics ($I_C$-$V_{SG}$) of the memory cell transistor 43 for each of three operating temperatures. The dashed curves show the current voltage characteristics for the transistor 69 for the same example operating temperatures. For any given operating temperature, $I_T=I_C+I_R$ over the operating range of the steering gate voltage $V_{SG}$.

As the steering gate voltage $V_{SG}$ is moved through its range in this modified version of FIG. 3, beginning at zero volts, the memory cell transistor 43 begins to conduct when $V_{SG}$ reaches its threshold ($V_T$), such as threshold 97 that exists when operating at 25° C. As $V_{SG}$ increases, $I_C$ increases from zero while $I_R$ decreases by the same amount. If the transistors 43 and 69 have the same characteristics, as has been described above in a particular implementation, all of the operating curves of FIG. 4 pass through a point 95 where, for a particular steering gate voltage $V_{SG1}$, the currents $I_C$ and $I_R$ are each equal to each other, each having a value of ½$I_T$.

One aspect of the operation of the circuit of FIG. 3 as shown, without the modification assumed in the preceding two paragraphs, is illustrated by the curves of FIG. 4A. When the steering gate voltage $V_{SG}$ is low, the voltage at node 77 is substantially that of the supply voltage $V_{DD}$. But when the steering gate voltage reaches the value $V_{SG1}$, the voltage at node 77 drops in a step-like manner to a value substantially that of the supply voltage $V_{SS}$, shown in this case to be ground (zero volts) potential. This drop occurs at the same voltage $V_{SG1}$ as the common crossover current value 95 of FIG. 4A. It is detected and outputted by the sensing circuit 63.

Programming the storage element of the example memory cell transistor 43 consists of a series of program/verify cycles. This series stops when the cell, considered programmed, presents, for a steering gate voltage equal to $V_{SG1}$, a current $I_C$ that is equal to the current $I_R$. The most significant advantage of the circuit of FIGS. 2 and 3 is that the memory cell is read by the same steering gate voltage $V_{SG1}$ over a wide range of temperatures of the circuit chip. The output characteristic of FIG. 4B remains the same over a wide range of temperatures. The voltage at node 75, which is connected to the source of memory cell transistor 43, is automatically adjusted in response to changing temperatures.

A schematic diagram of one implementation of current source 67 is also shown in FIG. 3. In this implementation, current source 67 uses a current mirror arrangement, in which a programming current source 87 provides a current to a programming transistor 89. Because the gate and drain of transistor 89 are connected, this arrangement creates a programming gate voltage that may be supplied to multiple mirroring transistors 91. The mirroring transistors 91 may be designed with a gate width and length proportional to the dimensions of transistor 89, so that the mirroring transistors 91 each conduct a current proportional to that generated by current source 87.

One mirroring transistor 91 may be provided for each bit line in the memory cell array. As previously described, bit line decoding circuitry 59 (shown in FIG. 2) establishes a connection between one of the transistors 91 and its corresponding bit line. This space-efficient arrangement allows a current source to be provided for each bit line in the memory cell array, while using only one transistor per bit line.

Although the present invention and its advantages have been described in detail, it should be understood that various changes, substitutions, and alterations can be made therein without departing from the spirit and scope of the invention as defined by the appended claims.

It is claimed:

1. A non-volatile memory, comprising:
    a data storage cell including a storage element, a control gate and first and second source/drain terminals;
    a first current source operable to provide a first current to the first source/drain terminal;
    a node electrically connected to the second source/drain terminal;
    a bias circuit operable to provide a bias voltage to the node, the bias voltage varying with temperature, the variation of the bias voltage being approximately inverse to a thermal variation of a threshold voltage of the data storage cell; and
    a control gate voltage circuit operable to provide a voltage level to the control gate.

2. The non-volatile memory of claim 1, further comprising a data sense circuit coupled to the first source/drain terminal of the data storage cell, the data sense circuit being operable to sense a voltage at the first source/drain.

3. The non-volatile memory of claim 1, wherein the bias circuit comprises:
    a second current source connected to the node;
    a reference voltage generator operable to generate a reference voltage, the reference voltage being invariant with temperature; and
    a bias transistor having a first source/drain terminal coupled to the node, the bias transistor having a gate terminal coupled to the reference voltage generator.

4. The non-volatile memory of claim 1, wherein the control gate voltage circuit is operable to provide a predetermined sequence of voltage levels to the control ate of the data storage element during a read cycle of the data storage element.

5. A non-volatile memory comprising:
    means for storing data, the means comprising a charge storage element, a control ate and first and second source/drain terminals;
    means for providing a first current to the first source/drain terminal of the data storage means;
    means for providing a bias voltage to the second source/drain terminal of the data storage means, the bias voltage varying with temperature, the variation of the bias voltage being approximately inverse to a thermal variation of a threshold voltage of the data storage means; and
    means for providing a voltage level to the control gate of the data storage element.

6. The non-volatile memory of claim 5, further comprising means for sensing a voltage at the first source/drain terminal of the data storage means.

7. The non-volatile memory of claim 6, wherein the means for providing the bias voltage comprises:
    means for drawing a second current from the second source/drain terminal of the data storage means;
    means for generating a reference voltage, the reference voltage being approximately invariant with temperature; and
    a bias transistor having a first source/drain terminal coupled to the second source/drain terminal of the data storage means, the bias transistor having a gate terminal coupled to the means for generating the reference voltage.

8. The non-volatile memory of claim 7, wherein the means for providing a voltage level to the control gate of the data storing means is operable to provide a predetermined sequence of voltage levels to the control gate of the data storing means during a read cycle of the data storing means.

9. A method for reading stored data from a non-volatile memory, comprising:
    conducting a first current through a first source/drain terminal of an EEPROM transistor, the EEPROM transistor having a second source/drain terminal coupled to a node;

conducting current through the node by a current source;

providing a thermally invariant bias voltage to a gate of a transistor, the transistor having a source/drain terminal coupled to the node, the transistor conducting at least a portion of the current being passed through the node by the current source;

providing a voltage to a control gate of the EEPROM transistor; and detecting a voltage at the first source/drain terminal of the EEPROM transistor.

10. The method of claim 9, further comprising:

providing a sequence of voltages to the control gate of the EEPROM transistor;

detecting a decline in the voltage at the first source/drain terminal of the EEPROM transistor; and determining, from the decline in the voltage at the first source/drain terminal of the EEPROM transistor, which voltage of the sequence of voltages causes the EEPROM transistor to conduct.

11. The method of claim 10, further comprising determining a numerical value stored by the EEPROM transistor in response to the determination of the voltage that causes the EEPROM transistor to conduct.

12. A method of operating an array of non-volatile memory cells that individually have at least one storage element positioned over at least a portion of a channel between source/drain terminals and a control gate coupled with said at least one storage element, comprising:

addressing one or more of the cells for simultaneously reading or programming data therein, applying a level of electrical supply to at least one of the source/drain terminals of the addressed cells that varies as a function of a temperature of the memory cell array, and applying a set of voltages to the control gates of the addressed cells that are independent of the temperature of the memory cell array.

* * * * *

UNITED STATES PATENT AND TRADEMARK OFFICE
CERTIFICATE OF CORRECTION

PATENT NO. : 6,560,152 B1
DATED : May 6, 2003
INVENTOR(S) : Raul-Adrian Cernea

It is certified that error appears in the above-identified patent and that said Letters Patent is hereby corrected as shown below:

Column 8,
Line 25, after "voltage levels to the control", delete "ate" and insert -- gate --.
Line 30, after "storage element, a control", delete "ate" and insert -- gate --.

Signed and Sealed this

Twenty-third Day of September, 2003

JAMES E. ROGAN
*Director of the United States Patent and Trademark Office*